United States Patent
Cokely et al.

(10) Patent No.: US 6,524,888 B2
(45) Date of Patent: Feb. 25, 2003

(54) METHOD OF ATTACHING A CONFORMAL CHIP CARRIER TO A FLIP CHIP

(75) Inventors: David N. Cokely, Apalachin, NY (US); Thomas M. Culnane, Lanesboro, PA (US); Lisa J. Jimarez, Newark Valley, NY (US); Miguel A. Jimarez, Newark Valley, NY (US); Li Li, Endicott, NY (US); Donald I. Mead, Montrose, PA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/037,536

(22) Filed: Jan. 4, 2002

(65) Prior Publication Data

US 2002/0096746 A1 Jul. 25, 2002

Related U.S. Application Data

(62) Division of application No. 09/116,368, filed on Jul. 16, 1998, now Pat. No. 6,337,509.

(51) Int. Cl.[7] .......................... H01L 21/44; H01L 21/48; H01L 21/50; H01L 21/76
(52) U.S. Cl. ........................................ 438/108; 438/456
(58) Field of Search .................................. 438/108, 456

(56) References Cited

U.S. PATENT DOCUMENTS

| 5,109,302 A | 4/1992 | Bourdelaise et al. |
| 5,159,535 A | 10/1992 | Desai et al. |
| 5,201,451 A | 4/1993 | Desai et al. |
| 5,207,585 A | 5/1993 | Byrnes et al. |
| 5,214,308 A | 5/1993 | Nishiguchi et al. |
| 5,413,489 A | 5/1995 | Switky |
| 5,447,886 A | 9/1995 | Rai |
| 5,457,344 A | 10/1995 | Bartelink |
| 5,497,033 A | 3/1996 | Fillion et al. |
| 5,528,159 A | 6/1996 | Charlton et al. |
| 5,530,291 A | 6/1996 | Chan et al. |
| 5,679,977 A | 10/1997 | Khandros et al. |
| 5,685,885 A | 11/1997 | Khandros et al. |
| 5,729,896 A | 3/1998 | Dalai et al. |
| 5,773,320 A | 6/1998 | Beyerer |
| 5,977,640 A | 11/1999 | Bertin et al. |
| 6,069,027 A | 5/2000 | Mertol et al. |

OTHER PUBLICATIONS

"Small Copper Block Application for Solder Bump Joined Chip Replacement", Aug. 1, 1991, IBM Tech. Dis. Bulletin, vol. 34, No. 3, pp. 52–53.*
IBM Technical Disclosure Bulletin (1992) 23 (11), pp. 362–363.

(List continued on next page.)

*Primary Examiner*—Olik Chaudhuri
*Assistant Examiner*—Howard Weiss
(74) *Attorney, Agent, or Firm*—Scully, Scott, Murphy & Presser; John R. Pivnichny

(57) ABSTRACT

Mixtures for attaching a semiconductor chip to a substrate. The semiconductor chip has an array of joining material bumps, such as C4 solder balls. The substrate has an array of conductive pads corresponding to the array of joining material bumps. In a first embodiment the fixture has a body having a first cavity containing the semiconductor chip and a second cavity for containing the substrate. The substrate is placed over the semiconductor chip with the conductive pads opposing and in contact with the joining material bumps, such that during reflow of the joining material bumps, the weight of the substrate acts against the joining material bumps and aids in the attachment of the semiconductor chip to the substrate to form electrical connections therebetween.

11 Claims, 8 Drawing Sheets

OTHER PUBLICATIONS

M. Ecker (1984) "Separable, Conformal, Low Profile Connector Means", IBM Technical Disclosure Bulletin 27 (3), pp. 1499–1501.

"High Performance Carrier Technology: Materials And Fabrication", by Light et al., 1993 International Electronics Packaging Conference, San Diego, California, vol. 1.

"High Performance Carrier Technology", by Heck et al., 1993, International Electronics Packaging Conference, San Diego, California, vol. 1.

"Process Considerations in the Fabrication of Teflon Printed Circuit Boards", by Light et al., 1994, Proceedings, 44 Electronic Components & Technology Conference, 5/94.

* cited by examiner

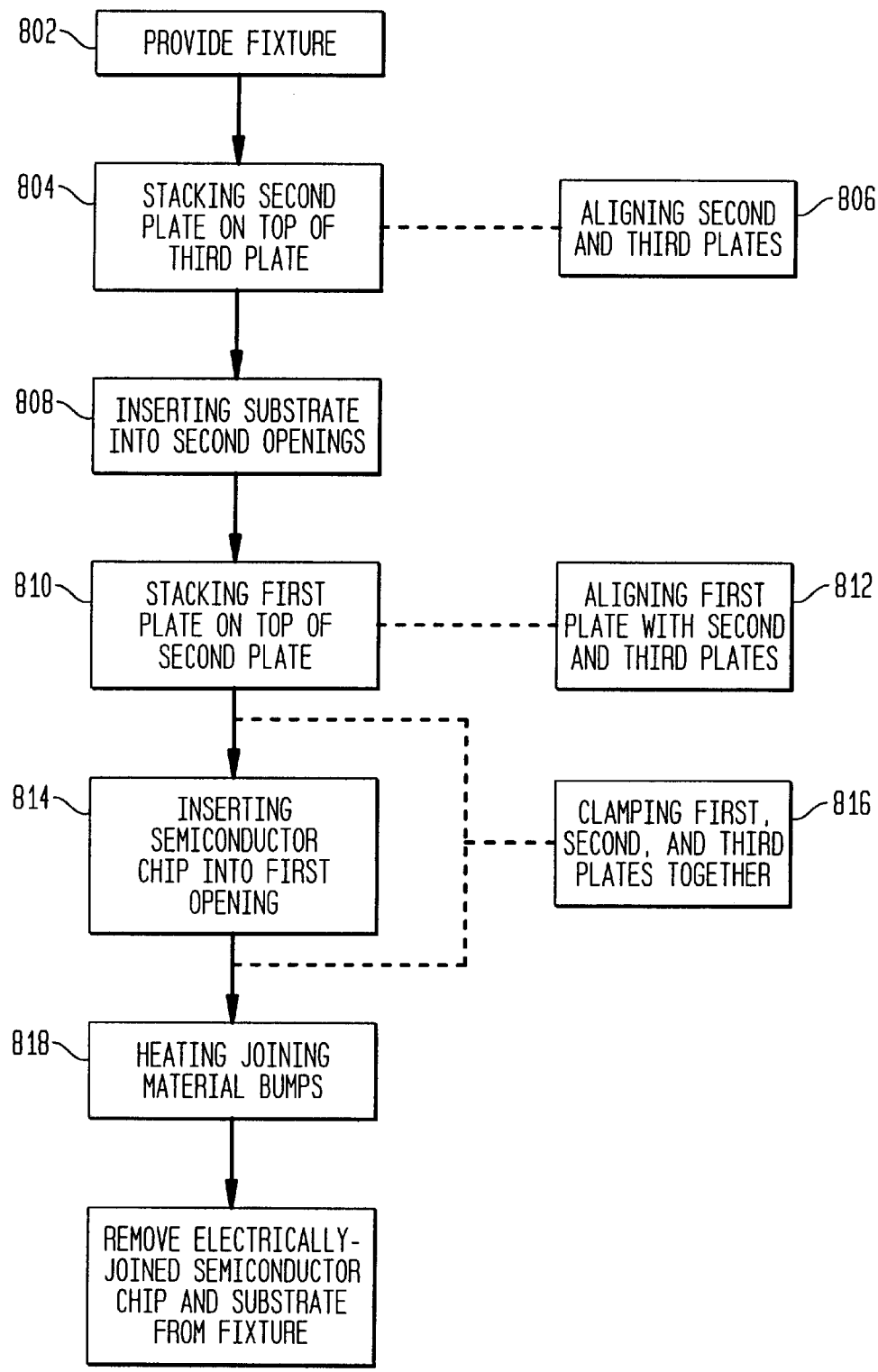

METHOD OF ATTACHING A CONFORMAL CHIP CARRIER TO A FLIP CHIP

BACKGROUND OF THE INVENTION

This application is a divisional of U.S. application Ser. No. 09/116,368, filed Jul. 16, 1998; now U.S. Pat. No. 6,337,509.

FIELD OF THE INVENTION

The field of art to which this invention relates is electronic packaging. More specifically, the present invention relates to a method and apparatus for assembling a conformal chip carrier to a flip chip.

DESCRIPTION OF THE RELATED ART

Typically, one or more semiconductor chips, or other such electronic devices, are mounted on a first circuitized substrate (called a semiconductor chip carrier, or more generally, a first level electronic package), which, in turn, is mounted on a second circuitized substrate such as a printed circuit card or board (more generally called a second level electronic package). The electronic devices mounted on the first level electronic package are electrically connected through the circuitry of the first level package to the circuitry of the second electronic package. The resulting structure may be used as part of a computer or other such equipment.

A particularly versatile first level electronic package is a flexible film, or conformal, semiconductor chip carrier. This type of first level electronic package comprises a circuitized flexible substrate and having circuitry formed on at least one side. A semiconductor chip, or other such electronic device, may be mounted on pads, such as controlled collapse chip connection (C4) pads, which are part of the circuitry formed on the flexible substrate. Conventional techniques are used to mount the flexible film chip carrier to the semiconductor chip. One such technique is called solder reflow which uses solder bumps, such as C4 solder balls corresponding to the C4 pads. With each contact pad on the chip carrier being positioned on the appropriate solder bump on the chip, the assembly is heated so as to liquefy the solder and bond each contact pad on the chip carrier to the confronting solder bump on the chip.

Conformal chip carriers are very difficult to assemble a flip chip to. The reason being is the organic substrate from which the chip carrier is fabricated, is very soft due to the dielectric being a thermal plastic (no polymer cross linking), being filled with silica particles, and not having glass cloth for stiffness. The problem arises when a flip chip is placed on top of a compliant structure and thermal cycled during solder reflow. The chip remains rigid but the compliant structure sags or bows during the thermal cycling causing it to separate or detach from the solder bumps on the chip surface. This separation causes opens between the chip and the organic carrier. This problem is magnified as the chip size and the number of C4 solder balls on the chip increase.

More traditional organic chip carriers have been made out of epoxy (thermal set with polymer cross linking) and woven glass dielectrics which makes the total structure of the chip carrier and chip rigid. Thus, when the chip is placed onto the organic structure and thermal cycled during solder reflow the chip carrier does not pull away from the chip. However, these traditional chip carriers are for low temperature reflow and cannot be used with the high temperature reflows associated with C4 techniques.

Another approach to the problem of chip carrier separation during reflow has been to attach a metal stiffener (a "picture frame") to the conformal organic chip carrier with adhesives prior to chip attachment. This approach helps to some extent, but z-axis (sag or bow) movement still occurs in the chip area which will create opens. Another problem is that the adhesive used, limits the reflow temperatures allowed or would require new adhesives to be developed which would be able to withstand higher temperatures..

Yet another approach to the problem is to stretch the chip carrier taut. This is accomplished by pulling the carrier on four corners and holding it in tension during the reflow process. This requires additional room on the carrier for tooling holes and has only been done on flexible polyimide carriers at traditional reflow temperatures (i.e., peak temperatures of 220° C.).

Furthermore, alignment of the chip carrier with the chip can be done with manual split field optical systems to view the ball surface of the chip and the pad surface of the chip carrier so that both can be aligned, or with fully automated and costly in-line advanced placement tools. This is a necessary step in the packaging processes of the prior art. However, the alignment of the balls with the pads does not have to be perfect, because of the inherent self-alignment properties of the C4 techniques. If the ball is contacting any portion of a corresponding pad, the ball will self-align with the pad. However, the prior art methods for attaching a conformal chip carrier to a flip chip do not take full advantage of this self-aligning feature because of the configuration of the chip relative to the chip carrier during reflow.

Therefore, there is a need in the art for a method and apparatus for attaching a conformal chip carrier to a chip, such as a flip chip, which eliminates sagging or bowing of the chip carrier during reflow, and thus eliminates opens, resulting in increased yields. In addition, there is a need in the art for a method and apparatus which takes advantage of the self-alignment properties of the C4 process and one which eases the alignment and attachment of complex chip patterns to conformal chip carriers.

SUMMARY OF THE INVENTION

Therefore, it is an object of the present invention to provide an apparatus and method for attaching a conformal chip carrier to a semiconductor chip which prevents the chip carrier from separating from the chip surface.

It is yet another object of the present invention to provide an apparatus and method for attaching a conformal chip carrier to a semiconductor chip which obviates the need for a rigid chip carrier structure.

It is yet another object of the present invention to provide an apparatus and method for attaching a conformal chip carrier to a semiconductor chip which eliminates the need for stiffener attachments to the conformal chip carriers during solder reflow.

It is yet another object of the present invention to provide an apparatus and method for attaching a conformal chip carrier to a semiconductor chip which is compatible with both low temperature reflow and C4 reflow.

It is yet another object of the present invention to provide an apparatus and method for attaching a conformal chip carrier to a semiconductor chip which takes advantage of the self-aligning characteristics of C4 solder balls.

It is still yet another object of the present invention to provide an apparatus and method for attaching a conformal chip carrier to a semiconductor chip which eliminates the need for costly and complicated alignment systems.

Accordingly, a first embodiment of a fixture for attaching a semiconductor chip to a substrate is disclosed. The semiconductor chip has an array of joining material bumps. The substrate has an array of conductive pads corresponding to the array of joining material bumps. The fixture has a body having a first cavity for containing the semiconductor chip and a second cavity in communication with the first cavity for containing the substrate. The substrate is placed over the semiconductor chip with the conductive pads opposing and in contact with the joining material bumps, such that during reflow of the joining material bumps, the weight of the substrate acts against the joining material bumps and aids in the attachment of the semiconductor chip to the substrate to form electrical connections therebetween. The dimensions of the first and second cavities preferably have tolerances such that upon holding of the tolerances, the joining material bumps are ensured to line up with at least an edge of the conductive pads thus eliminating the need for alignment systems.

A second embodiment of a fixture for attaching the semiconductor chip to the substrate is also disclosed. The fixture comprises a first plate having a first opening for disposal of the semiconductor chip therein, a second plate stacked below the first plate and having a thickness substantially equal to the thickness of the substrate, the second plate further having a second opening opposing the first opening for disposal of the substrate therein, and a third plate stacked below the second plate such that the substrate is flattened in the second opening under the weight of the first plate thereby aiding in the attachment of the joining material bumps to their corresponding conductive pads during solder reflow to form electrical connections therebetween.

Also disclosed are methods for attaching the semiconductor chip to the substrate using the fixtures of the present invention.

In a preferred embodiment of both the apparatus and method of the present invention, the joining material bumps are solder balls attached to the semiconductor chip in accordance with a C4 process and the substrate is a conformal chip carrier.

BRIEF DESCRIPTION OF THE DRAWINGS

These and other features, aspects, and advantages of the apparatus and methods of the present invention will become better understood with regard to the following description, appended claims, and accompanying drawings where:

FIG. 8 illustrates a flow chart outlining the steps of a method of the present invention which utilizes the second embodiment of the fixture of the present invention.

DETAILED DESCRIPTION OF THE PREFERRED EMBODIMENTS

Although this invention is applicable to numerous and various types of semiconductor chips and substrates it has been found particularly useful in the environment of flip chips and conformal chip carriers. Therefore, without limiting the applicability of the invention to flip chips and conformal chip carriers, the invention will be described in such environment.

Figure 1:
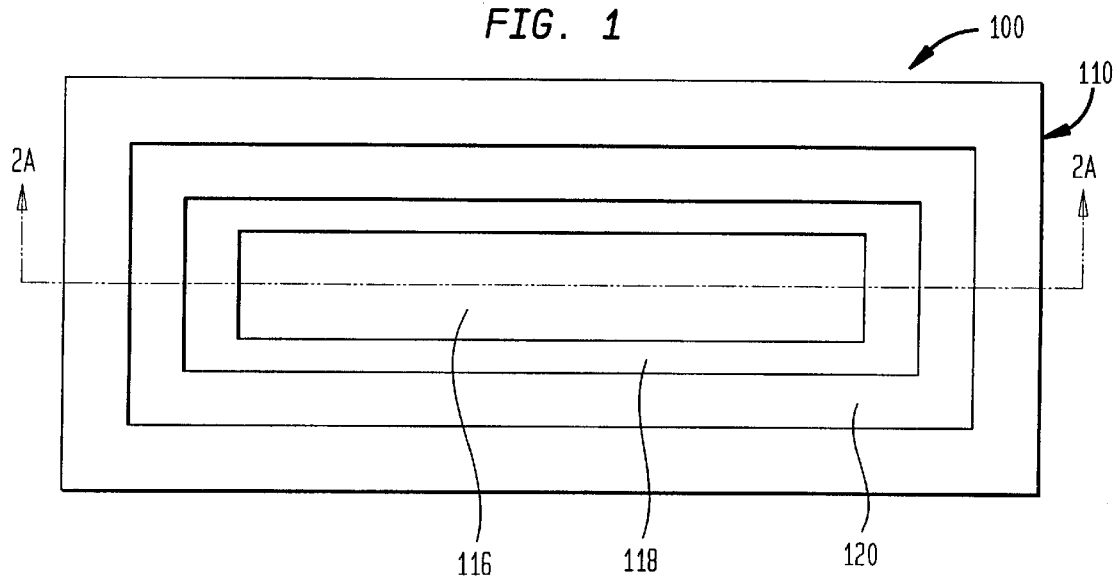
FIG. 1 illustrates a top, or plan view, of a first embodiment of the fixture of the present invention.
Figure 2A:
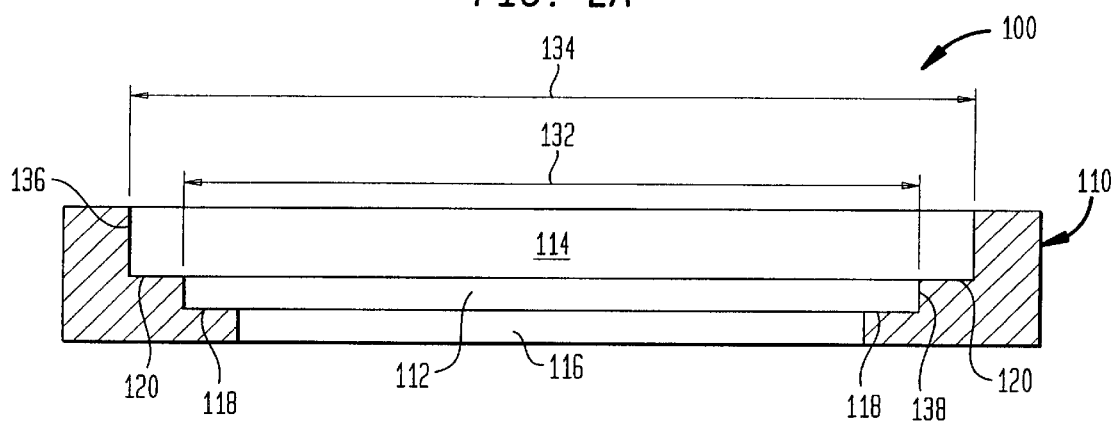
FIG. 2A illustrates a sectional view of the fixture of FIG. 1 taken about line 2A—2A.
Figure 2B:
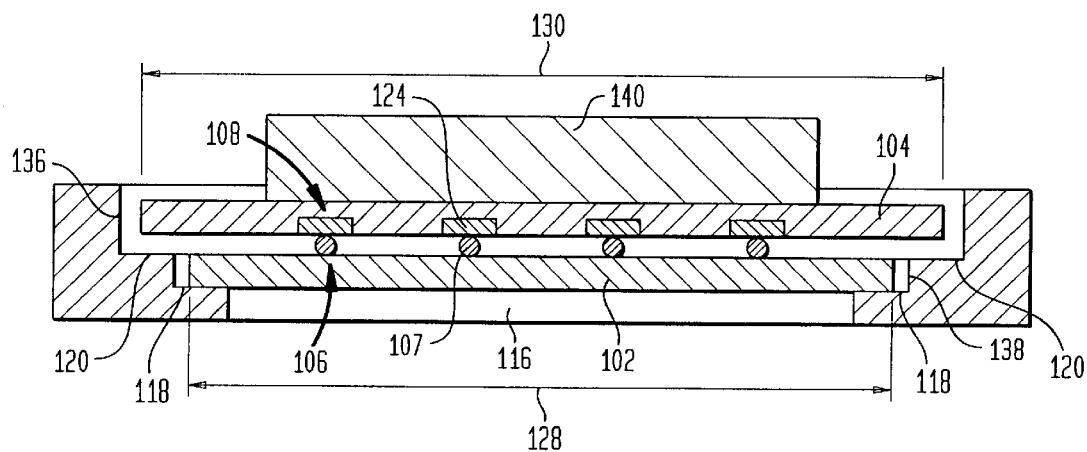
FIG. 2B illustrates the sectional view of FIG. 2A with the chip, chip carrier, and weight disposed therein.

Referring now to FIGS. 1, 2A and 2B, therein is illustrated a first embodiment of a fixture of the present invention, generally referred to by reference numeral 100. The fixture 100 is for attaching a semiconductor chip 102 to a substrate 104. The substrate 104 is preferably a conformal chip carrier as previously described. The semiconductor chip 102 has an array of joining material bumps 106. The substrate 104 has an array of conductive pads 108 corresponding to the array of joining material bumps 106. Preferably, the semiconductor chip 102 is a flip chip in which the array of joining material bumps 106 are solder balls, individually referred to by reference numeral 107, attached to the flip chip with a controlled collapse connection process (C4), the process of which is well known in the art.

The fixture 100 comprises a body 110 having a first cavity 112 for containing the semiconductor chip 102 and a second cavity 114 in communication with the first cavity 112 for containing the substrate 104. A through hole 116 is preferably utilized for allowing heat transfer to the semiconductor chip 102 from the bottom of the fixture 100, for reducing the weight of the fixture 100, and to ensure that the semiconductor chip 102 lays flat about edges 118. The substrate 104 is placed over the semiconductor chip 102 with the conductive pads 108 opposing and in contact with the joining material bumps 106. Typically, the substrate is first fluxed to wet the solder bumps 106 and pads 108 before being placed over the semiconductor chip 102. The depth of the first cavity 112 is such that when the joining material bumps 106 of the semiconductor chip 102 extend into the second cavity 114 and the substrate 104 is placed thereupon, the substrate 104 does not rest on the edges 120 of the second cavity 114, but is elevated therefrom a predetermined distance.

Upon heating of the fixture 100, semiconductor chip 102 and substrate 104, the joining material bumps 106 melt, this is termed reflow. During reflow of the joining material bumps 106, the weight of the substrate 104 acts against the joining material bumps 106 and aids in the attachment of the semiconductor chip 102 to the substrate 104 to form electrical connections therebetween. Furthermore, the substrate 104 is fully supported by the semiconductor chip 102 and joining material bumps 106 and is prevented from sagging.

Figure 3:
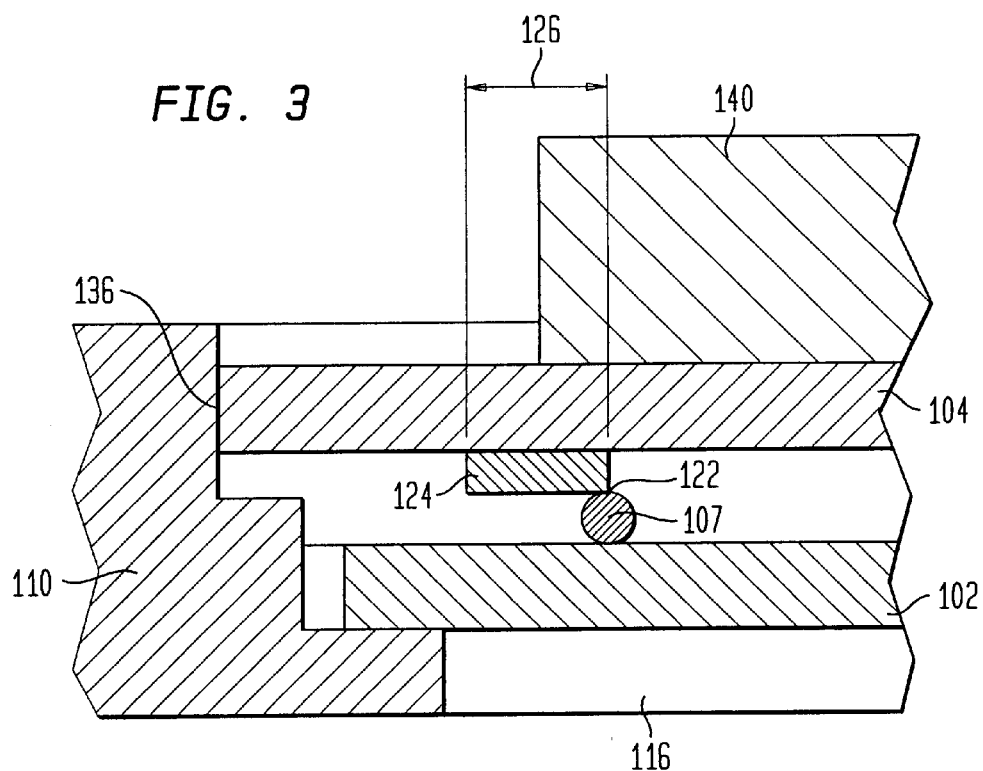
FIG. 3 illustrates a partial sectional view of the fixture of FIG. 2 showing the relationship of the conductive pad relative with the solder ball before reflow.
Figure 4:
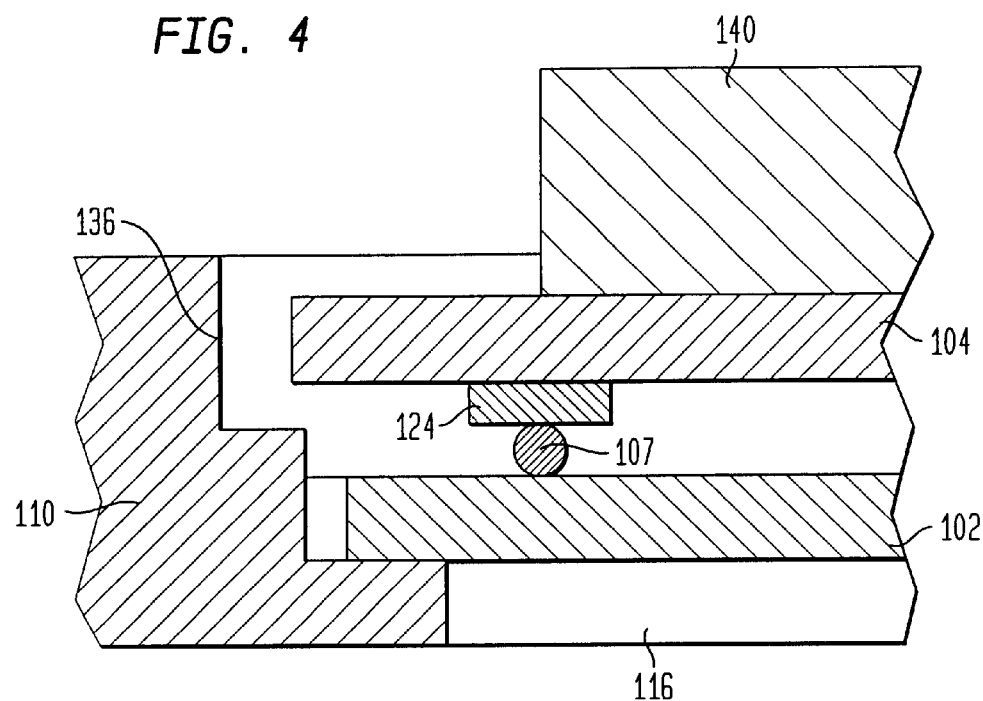
FIG. 4 illustrates a partial sectional view of the fixture of FIG. 2 showing the relationship of the conductive pad relative with the solder ball after reflow.

Referring now to FIGS. 3 and 4, the first and second cavities 112, 114, respectively, of the fixture 100 are preferably toleranced such that upon holding of the tolerances, each of the joining-material bumps (shown in the form of an individual solder ball 107) are ensured to line up with at least an edge 122 of each of the individual conductive pads 124. The tolerances are determined by simple geometric considerations. The following discussion will focus on the tolerancing of the lengths of the first and second cavities 112, 114, respectively. It should be apparent to someone skilled in the art, that the same analysis is used concerning the tolerancing of the width of the first and second cavities 112, 114, respectively.

The conductive pads 124 have a certain diameter 126. The semiconductor chip 102 and substrate 104 have certain lengths 128, 130, respectively, as do the first and second cavities 132, 134, respectively. In addition, each of the above, namely, the diameter 126 of the joining material bumps 107, and the lengths 128, 130, 132, and 134 of the semiconductor chip 102, substrate 104, and first and second cavities 112, 114, respectively, each have their own tolerances by which they are manufactured. Using all of these dimensions and tolerances, a length and tolerance are chosen for the first and second cavities 112, 114, such that each of the joining material bumps 107 of the joining material bump array 106 line up with at least an edge 122 of their corresponding conductive pad 124. Put simply, the first and second cavities, 112, 114, respectively are sized such that even if the semiconductor chip 102 and substrate 104 shift within their respective cavities to opposite walls 136, 138, the joining material bumps 107 would still align with and contact at least an edge 122 of their corresponding conductive pad 124, as shown in FIG. 3. If such is the case, then the self-aligning capability of the joining material bumps 106, such as C4 solder balls, will ensure that the joining material bumps 106 align with their corresponding conductive pads 108 during reflow, as shown in FIG. 4. This eliminates the need for costly automated placement equipment or time consuming manual alignment systems used in the art. This also allows the use of more complex joining material bump arrays 106, since their alignment is ensured by being built-in to the fixture 100.

Referring back to FIG. 2B, the fixture 100 of the present invention can also include a weight 140 placed over the substrate 104 and acting against the substrate 104 for further aiding in the attachment of the semiconductor chip 102 to the substrate 104. The principle purpose of the weight 140 is to correct any deformities of the substrate 104. Typically, the substrate 104 can have a wavy surface. The weight 140 aids in flattening the substrate 104 such that the proper connections can be made between the solder bumps 106 and corresponding solder pads 108. The weight 140 is preferably fabricated from a ceramic material and can even aid in the self-aligning capability of the joining material bumps 106 as long as a critical weight is not exceeded. The critical weight is the weight after which the joining material bumps 106 do not self-align with the conductive pads 108 due to the increased normal force the two exert upon each other.

Figure 5:
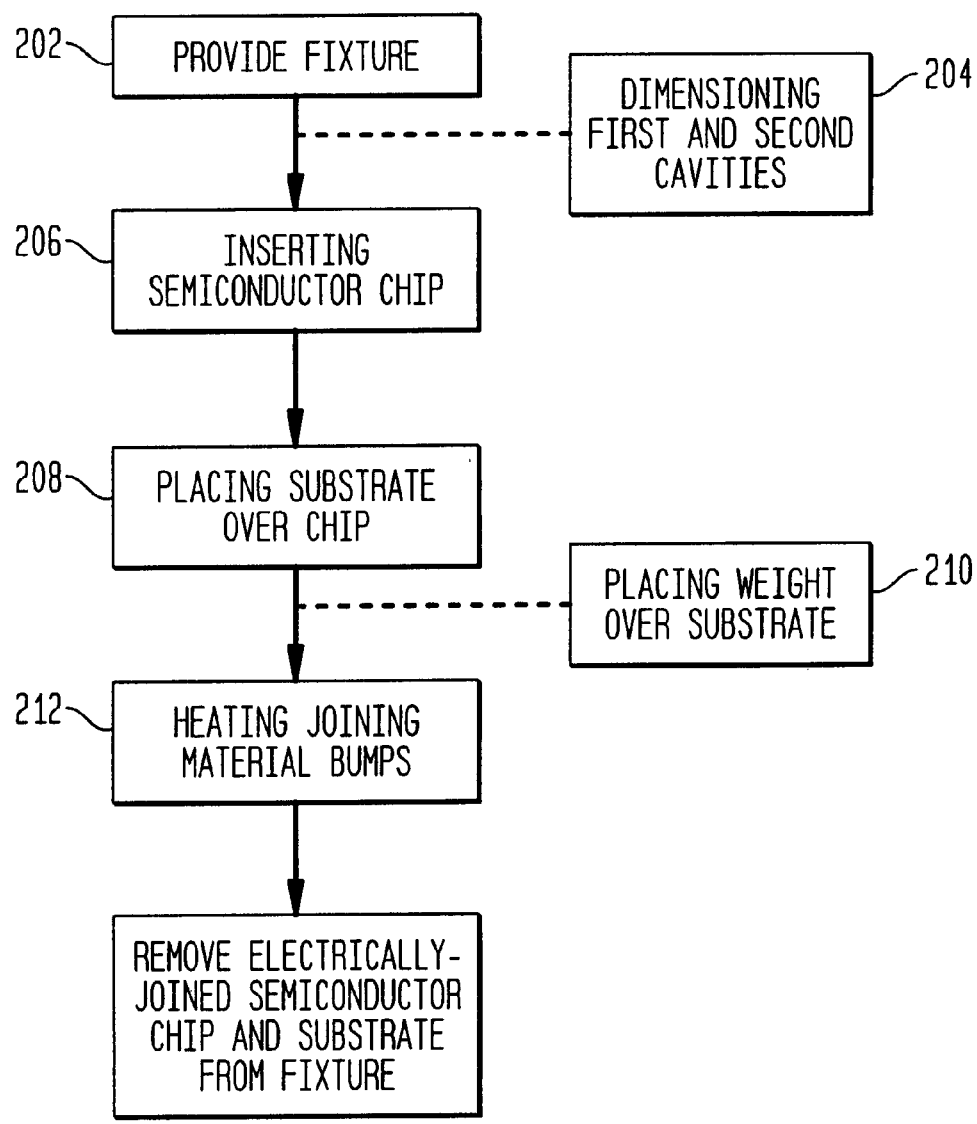
FIG. 5 illustrates a flow chart outlining the steps of a method of the present invention which utilizes the first embodiment of the fixture of the present invention.

A method of attaching the semiconductor chip 102 to the substrate 104 utilizing the first embodiment of the fixture 100 of the present invention will now be summarized with reference to FIG. 5. FIG. 5 illustrates the method of the present invention, generally referred to by reference numeral 200.

The method 200 includes step 202 in which the fixture 100 of the first embodiment of the present invention is provided. The fixture 100, in its simplest form, comprises the body 110 having the first cavity 112 for containing the semiconductor chip 102 and the second cavity 114 in communication with the first cavity 112 for containing the substrate 102. Preferably step 204 is performed in which the first and second cavities 112, 114, respectively, are dimensioned and fabricated to have tolerances such that upon holding of the tolerances, the joining material bumps 106 are ensured to line up with at least an edge 122 of the conductive pads 124. Thus, step 204 replaces the complicated, costly, and time consuming alignment steps of the prior art.

At step 206, the semiconductor chip is inserted into the first cavity 112 in the fixture 100 with the joining material bumps 106 facing upward. At step 208, the substrate is placed over the semiconductor chip with the conductive pads 108 opposing and in contact with the joining material bumps 106. As discussed previously, the substrate is typically fluxed before being placed over the semiconductor chip. If required due to surface deformities of the substrate, step 210 is performed in which the weight 140 is placed over the substrate 104 which acts to flatten the substrate for further aiding in the attachment of the semiconductor chip 102 to the substrate 104. Lastly, at step 212, the joining material bumps 106 are heated whereby the weight of the substrate 104 acts against the joining material bumps 106 and aids in the attachment of the semiconductor chip 102 to the substrate 104 to form electrical connections therebetween. The heating of the joining material bumps 106 is done at a temperature sufficient to cause reflow of the same and carried out using processes known in the art.

Figure 6:
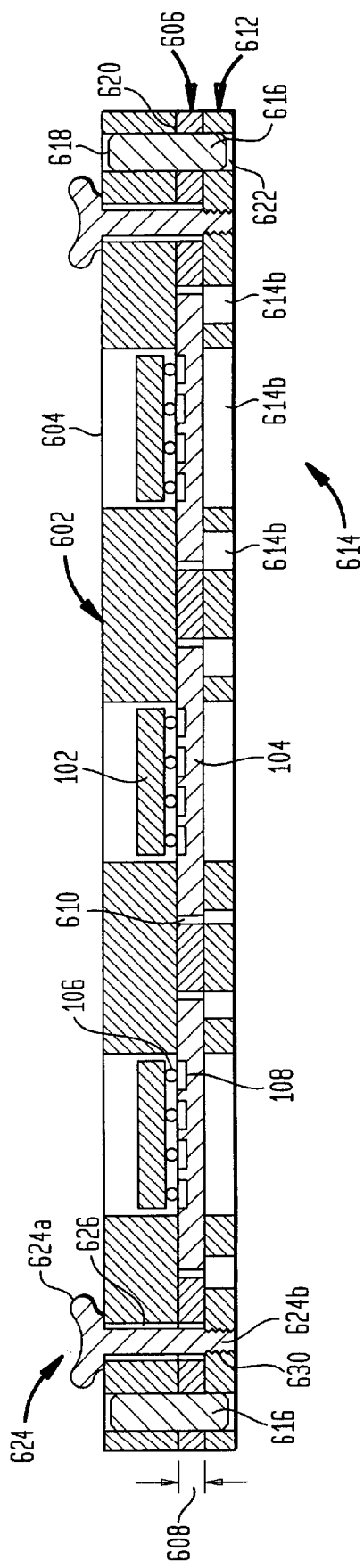
FIG. 6 illustrates a sectional view of a second embodiment of the fixture of the present invention.

Referring now to FIG. 6, there is illustrated a second embodiment of a fixture of the present invention, generally referred to by reference numeral 600, in which like elements from the first embodiment are numbered with like reference numerals. The fixture 600 is for attaching a semiconductor chip 102 to a substrate 104. The substrate 104 is preferably a conformal chip carrier as previously described. The semiconductor chip 102 has an array of joining material bumps 106. The substrate 104 has an array of conductive pads 108 corresponding to the array of joining material bumps 106. Preferably, the semiconductor chip 102 is a flip chip in which the array of joining material bumps 106 are solder balls attached to the flip chip with a controlled collapse connection process (C4), the process of which is well known in the art.

Figure 7A:
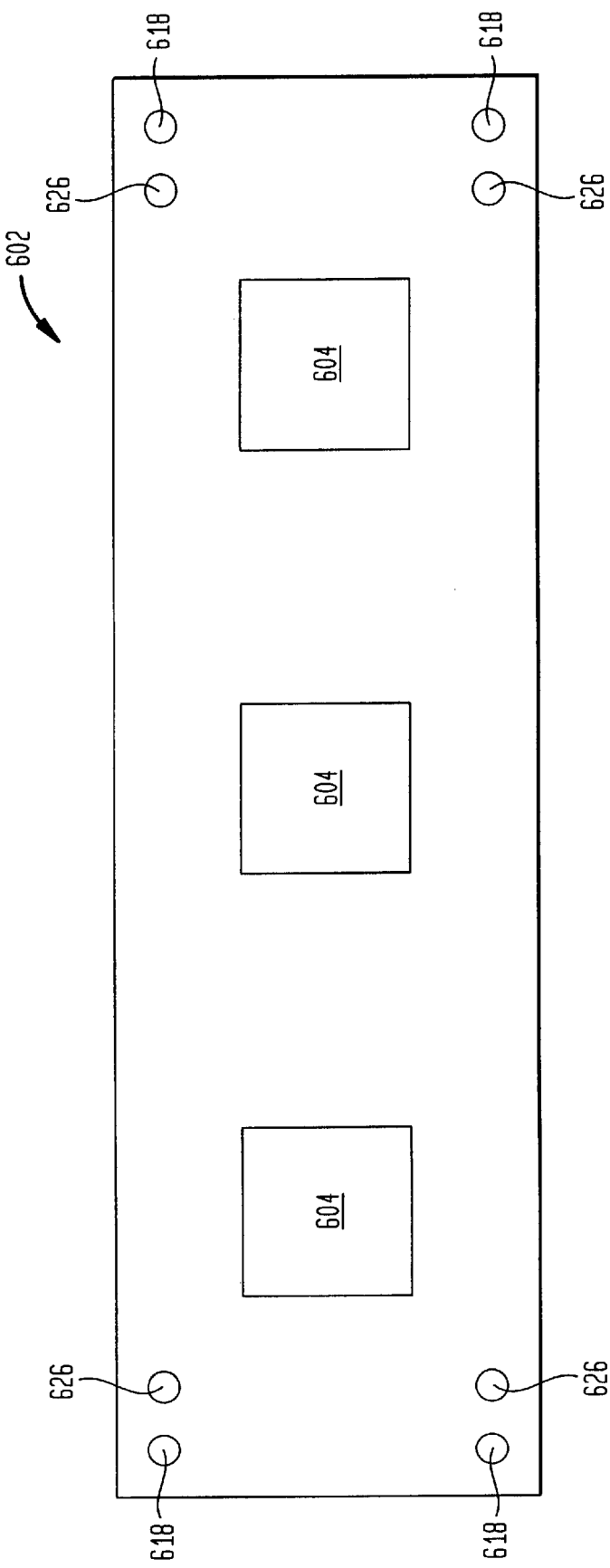
FIG. 7A illustrates a plan view of the top plate of the fixture of FIG. 6.
Figure 7B:
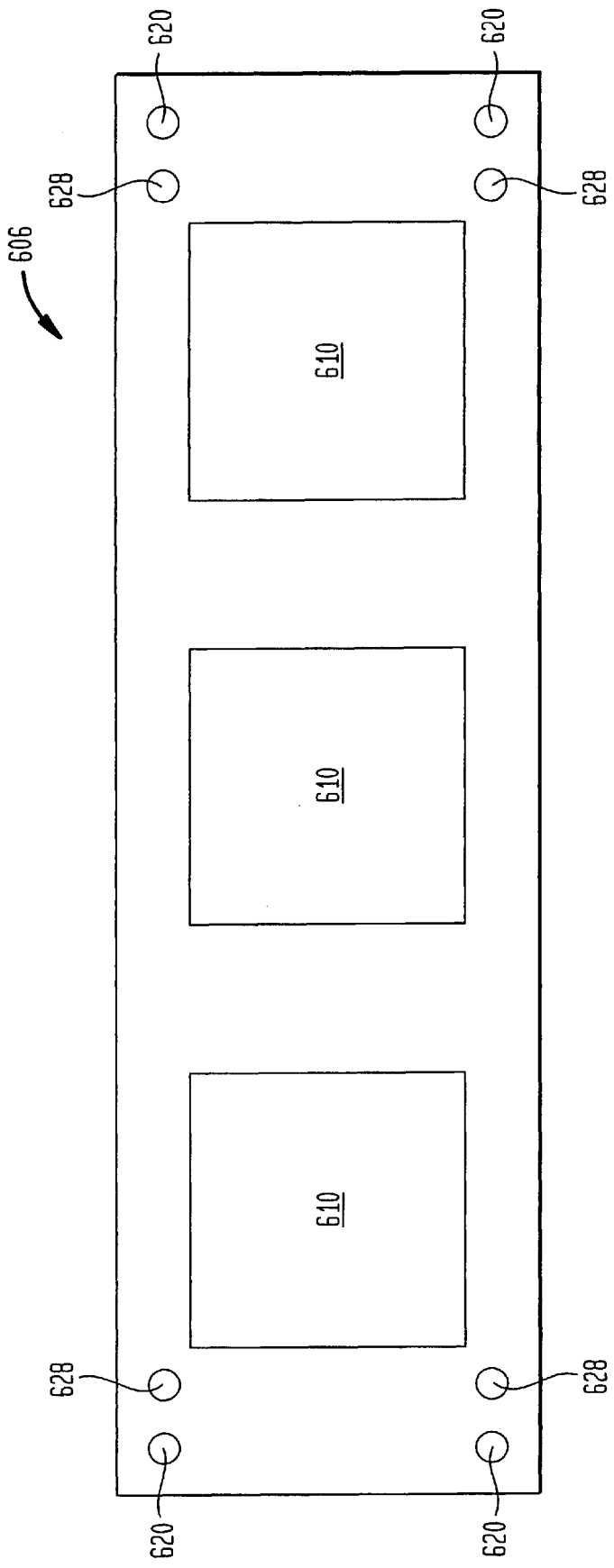
FIG. 7B illustrates a plan view of the middle plate of the fixture of FIG. 6.

The fixture comprises a first plate 602 having a first opening 604 for disposal of the semiconductor chip 102 therein. The first opening 604 is better illustrated with reference to FIG. 7A. Referring back to FIG. 6, the fixture also has a second plate 606 which is stacked below the first plate 602. The second plate 606 preferably has a thickness 608 substantially equal to the thickness of the substrate 104. The second plate 606 also has a second opening 610 which opposes the first opening 604 of the first plate 602 for disposal of the substrate 104 therein. The second opening 610 is better illustrated with reference to FIG. 7B.

Referring back to FIG. 6, the fixture lastly has a third plate 612 stacked below the second plate. The third plate 612 preferably has a third opening 614 opposing the second opening 610 to allow heat during solder reflow to contact the substrate 104 disposed in the second opening 610 for eliminating "oil canning" of the substrate that might occur if the third plate 612 did not have the third openings 614. The third opening 614 are illustrated better with reference to FIG. 7C, and preferably are configured with a central opening 614a surrounded by a number of slots 614b. Preferably, the first, second, and third plates 602, 606, and 612, respectively, are fabricated from 440 stainless steel to match the CTE of the substrate, thus eliminating CTE mismatches during reflow.

In a preferred version of the fixture 600 of the second embodiment of the present invention, the fixture 600 can accommodate more than one chip 102 and substrate 104 pair. In the fixture 600 shown in FIGS. 6 and 7A–7C, three such pairs are accommodated.

The fixture 600 of FIG. 6 preferably includes an aligning means for aligning the first, second, and third plates 602, 606, and 612, respectively. The aligning means preferably comprises at least two dowel pins 616, and most preferably at least four, each of which is disposed in aligned holes 618, 620, and 622 in the first, second, and third plates 602, 606, and 612, respectively. Aligned holes 618, 620, and 622 are better illustrated with reference to FIGS. 7A–7C.

Figure 7C:
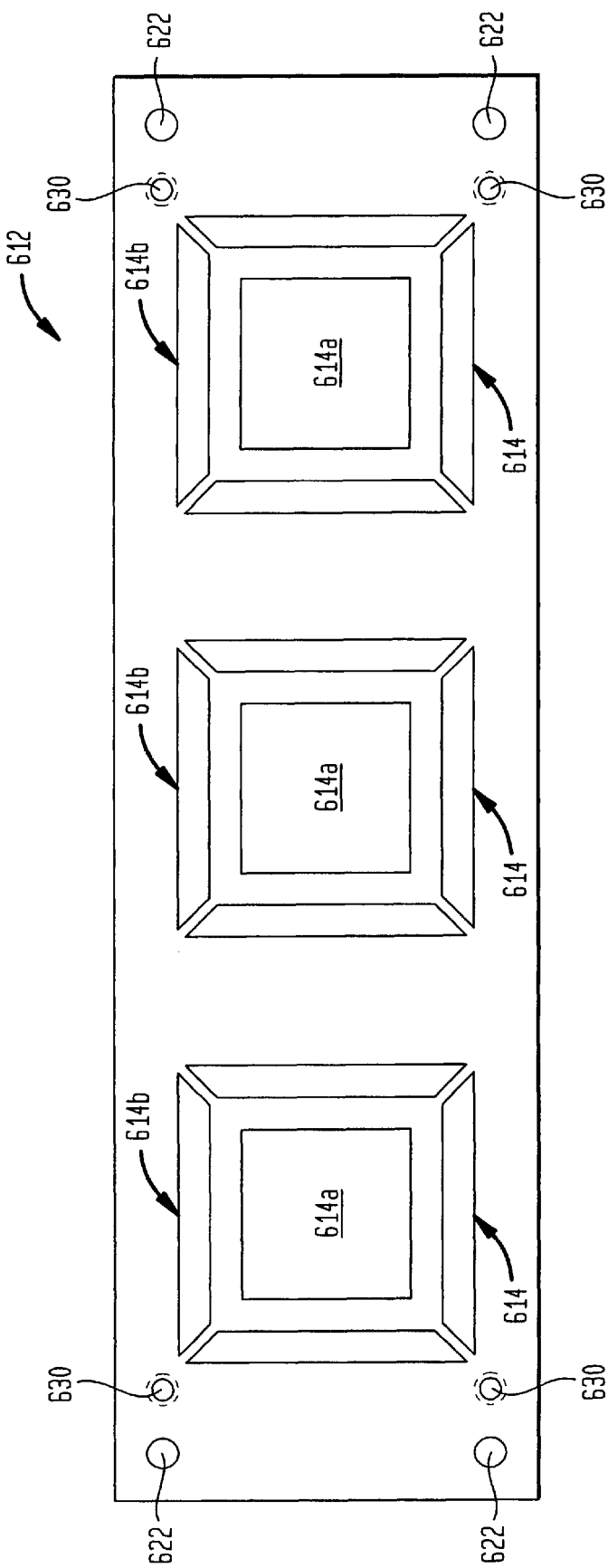
FIG. 7C illustrates a plan view of the bottom plate of the fixture of FIG. 6.

The fixture 600 of FIG. 6 also preferably includes a clamping means for clamping the first, second, and third plates 602, 606, and 612, respectively, together. The clamping means preferably comprises at least two threaded screws 624 and most preferably four as shown in FIGS. 6 and 7C. The threaded screw preferably has a head portion 624a and a threaded portion 624b. Each of the threaded screws 624 is disposed in aligned clearance holes 626, 628 in the first and second plates 602, 606, respectively, and mating with aligned threaded holes 630 in the third plate 612. Aligned clearance holes 626 and 628, and aligned threaded holes 630 are better illustrated with reference to FIGS. 7A–7C.

In operation, since the substrate 104 is substantially the same thickness as the second plate 606, the substrate 104 is flattened in the second opening 610 under the weight of the first plate 602, thereby aiding in the attachment of the joining material bumps 106 to their corresponding conductive pads 108 during solder reflow to form electrical connections therebetween. For this reason the first plate 602 is preferably relatively heavy such that the particular type and size substrate 104 used is flattened under its weight.

A method of attaching the semiconductor chip 102 to the substrate 104 utilizing the second embodiment of the fixture 600 of the present invention will now be summarized with reference to FIG. 8. FIG. 8 illustrates the method of the present invention, generally referred to by reference numeral 800.

The method 800 comprises providing the fixture 800 of the second embodiment of the present invention at step 802. At step 804 the second plate 606 is stacked upon the third plate 612. As discussed previously, the third plate 612 preferably includes third openings 614. In this preferable configuration of fixture 800, the method preferably includes step 806 in which the second and third openings 610, 614, respectively are aligned with each other such that the material joining bumps 106 are aligned with their corresponding conductive pads 108. It should be noted that an alignment system, as typically used in the art is also necessary with the fixture 800 of the second embodiment of the present invention.

At step 808, the substrate 104 is inserted into the second opening 610 with its conductive pads 108 facing upward toward the first plate 602. At step 810, the first plate 602 is stacked on top of the second plate 606 such that the substrate 104 is flattened in the second opening 610 under the weight of the first plate 602. Preferably, method 800 includes step 812 in which the first, second, and/or third openings 604, 610, and 614 respectively, are aligned with each other.

At step 814 the semiconductor chip 104 is inserted into the first opening 604 with its joining-material bumps 106 opposing and in contact with their corresponding conductive pads 108. As noted above, an alignment system as known in the art is needed for full alignment of the material joining bumps 106 with the conductive pads 108. Preferably, method 800 includes step 816 in which the first, second, and third plates 602, 606, and 612, respectively, are clamped together. Step 816 can be performed either immediately before or after step 814. Lastly, at step 818, the joining material bumps 106 are heated by known methods in the art, such as by C4 attachment, thereby attaching the joining material bumps 106 to their corresponding conductive pads 108 during solder reflow to form electrical connections therebetween.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method of attaching a semiconductor chip in a solder-effected connection to a substrate consisting of a conformal chip carrier, the semiconductor chip comprising a flip chip having an array of joining material bumps consisting of solder balls attached to said flip chip with a controlled collapse chip connection (C4) process, the substrate having an array of conductive pads corresponding to the array of joining material bumps, the method comprising:

providing a fixture comprising a body having a first cavity for containing the semiconductor chip and a second cavity in communication with the first cavity for containing the substrate, placing the substrate over the semiconductor chip with the conductive pads opposing and in contact with the joining material bumps, such that during reflow of the joining material bumps, at elevated temperatures commensurate with the type of solder utilized, causing the weight of the substrate to act against the joining material bumps and aid in the attachment of the semiconductor chip to the substrate to form electrical connections therebetween, and removing said fixture upon completion of said electrical connections between said semiconductor chip and said substrate.

2. The method of claim 1, wherein the dimensions of the first and second cavities have tolerances such that upon holding of the tolerances, the joining material bumps are ensured to line up with at least an edge of the conductive pads.

3. The method of claim 1, further comprising placing a weight over the substrate to act against the joining material bumps for further aiding in the attachment of the semiconductor chip to the substrate.

4. The method of claim 3, wherein the weight is fabricated from a ceramic material.

5. A method of fixture for attaching a semiconductor chip in a solder-effected connection to a substrate consisting of a conformal chip carrier, the semiconductor chip comprising a flip chip having an array of joining material bumps consisting of solder balls attached to said flip chip with a controlled collapse chip connection (C4) process, the substrate having an array of conductive pads corresponding to the array of joining material bumps, the method comprising:

providing a removable fixture comprising a first plate having a first opening for disposal of the semiconductor chip therein, stacking a second plate below the first plate, said second plate having a thickness substantially equal to the thickness of the substrate, the second plate further having a second opening opposing the first opening for disposal of the substrate therein, stacking a third plate below the second plate such that the substrate is flattened in the second opening under the weight of the first plate thereby aiding in the attachment of the joining material bumps to their corresponding conductive pads during solder reflow to form electrical connections therebetween; said third plate further being provided with a third opening opposing the second opening to allow heat during solder reflow at elevated temperatures commensurate with the type of solder utilized to contact the substrate disposed in the second opening, and removing said fixture from said interconnected chip carrier and chip upon completion of the solder-effected connections between said conformal chip carrier and said semiconductor chip.

6. The method of claim 5, further comprising providing an aligning means for aligning the first, second, and third plates.

7. The method of claim 6, wherein the means for aligning comprises at least two dowel pins each of which is disposed in aligned holes in the first, second, and third plates.

8. The method of claim 5, further comprising providing a clamping means for clamping the first, second, and third plates together.

9. The method of claim 8, wherein the clamping means comprises at least two threaded screws each of which is disposed in aligned clearance holes in the first and second plates and mating with aligned threaded holes in the third plate.

10. The method of claim 5, wherein the first, second and third plates are fabricated from stainless steel.

11. The method of claim 10, wherein the stainless steel is a series 440 stainless steel.

* * * * *